United States Patent [19]

Motz

[11] 4,231,091

[45] Oct. 28, 1980

[54] ENGINE CONTROL SYSTEM

[75] Inventor: Phillip R. Motz, Kokomo, Ind.

[73] Assignee: General Motors Corporation, Detroit, Mich.

[21] Appl. No.: 963,693

[22] Filed: Nov. 27, 1978

[51] Int. Cl.[3] ..................... G05B 15/00; H03K 3/017; F02B 5/00

[52] U.S. Cl. .................................... 364/431; 364/569; 364/900; 123/414; 123/417

[58] Field of Search ............... 364/424, 431, 442, 569; 123/32 EA, 32 EC, 117 R, 117 D

[56] References Cited

U.S. PATENT DOCUMENTS

| | | | |
|---|---|---|---|
| 3,749,073 | 7/1973 | Asplund | 123/117 R |
| 3,767,902 | 10/1973 | Estes et al. | 364/424 |
| 3,927,648 | 12/1973 | Kawai et al. | 173/117 D |
| 4,009,699 | 3/1977 | Hetzler et al. | 123/117 D |
| 4,048,965 | 9/1977 | Bianchi et al. | 123/32 EA |
| 4,052,967 | 10/1977 | Colling et al. | 123/117 D |
| 4,143,622 | 3/1979 | Klötzner et al. | 173/32 EC |
| 4,157,699 | 6/1979 | Mori | 123/117 D |

*Primary Examiner*—Felix D. Gruber
*Attorney, Agent, or Firm*—Albert F. Duke

[57] ABSTRACT

An engine control system includes a microprocessor responsive to engine operating parameters for developing control words representing a desired dwell and firing time for use in controlling engine spark timing. An engine control unit is coupled to the microprocessor and utilizes the control words in calculating the desired rise and fall of the spark timing output relative to reference pulses, indicative to engine crankshaft position. The engine control unit includes a free-running counter which serves as a time reference for determining the period of the input reference pulses and for predicting the time of rise and fall of the output. Prediction of the next rise is made when the output falls and prediction of next fall is made when the output rises. Predictions are made on the assumption of constant frequency reference pulses. Errors resulting from this assumption are corrected when a reference pulse occurs.

5 Claims, 4 Drawing Figures

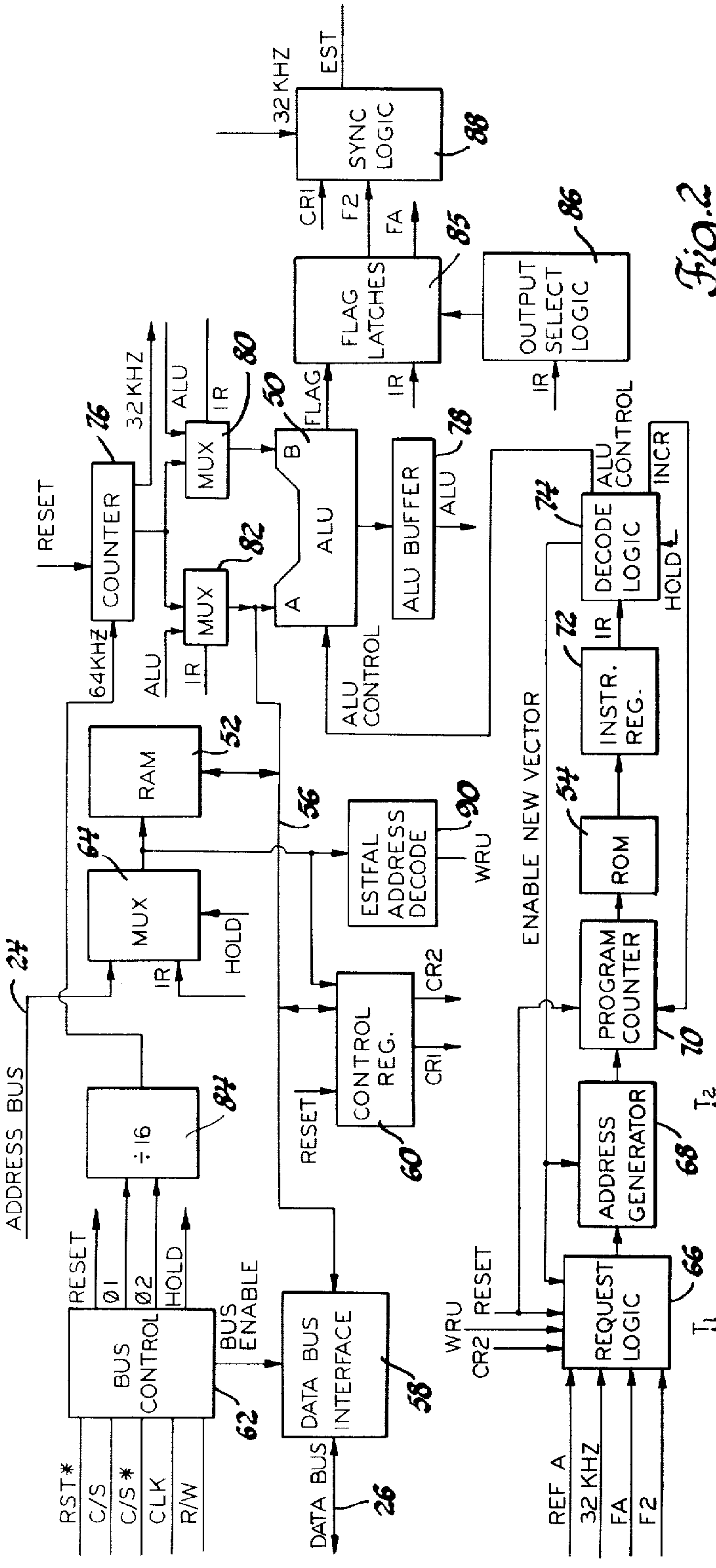
Fig. 2
| REGISTER | ADDRESS |
|---|---|
| REFPER | 00 |
| ESTDWELL | 0E |
| NEXR | 0F |
| OLDFAL | 10 |
| FALREF | 11 |
| RISREF | 12 |
| RISCHG | 13 |
| FALCHG | 14 |
| REFTIME | 16 |
| ESTFAL | 1B |
Fig. 2a
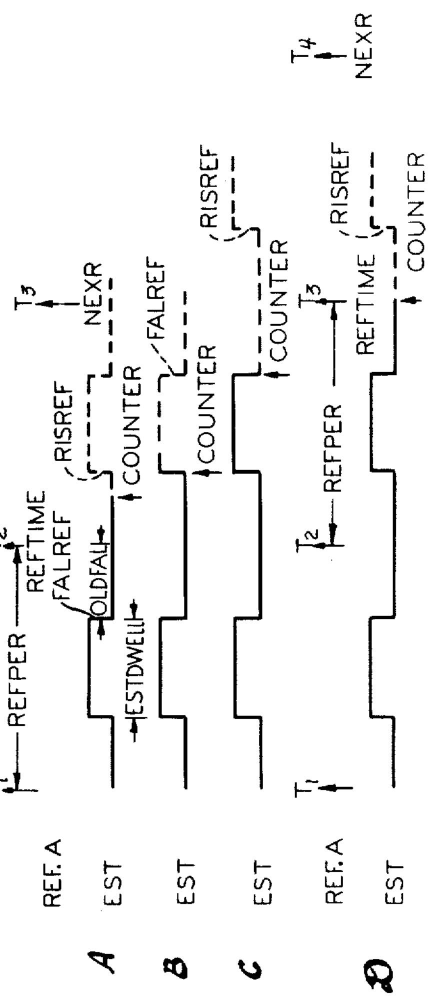
Fig. 3

ENGINE CONTROL SYSTEM

BACKGROUND AND SUMMARY OF THE INVENTION

This invention relates to engine control systems and, more particularly, to an engine control unit which is microprogrammed to generate an output pulse train of variable width and variable position relative to a variable frequency reference pulse train for controlling the spark timing of an engine. To achieve fuel economy, reduced unwanted exhaust emissions and improve engine performance and drivability, it is desirable to accurately control the various operations of an internal combustion engine such as spark timing, fuel metering and idle speed. Because of improved accuracy and lower costs, digital engine controllers have recently been proposed. The engine controllers of the prior art have generally been custom designed for a particular control function and require substantial redesign when additional control functions are subsequently desired.

In contrast to the prior art, the present invention utilizes a distributed processing approach wherein a microprogrammable engine control unit having arithmetic capability is interfaced with a microprocessor and engine control means and is capable of performing various engine control functions asynchronously with the processor to improve the throughput of the engine control system. More specifically, the engine control unit includes a RAM for parameter storage, a free-running counter for real time information, an arithmetic logic unit for data operations, output logic, and control logic for controlling the sequence of operations of the engine control unit. In a specific application disclosed, the engine control unit controls engine spark timing by raising an output signal to the ignition circuit at the start of a dwell period and lowering the signal at the correct firing point. The engine control unit uses dwell and firing time information supplied by the microprocessor to control the output signal relative to variable frequency input reference pulses. The reference pulses correspond to a predetermined engine crankshaft position and their frequency of occurrence is indicative of engine speed. The microprocessor responds to various engine parameters for developing control words specifying dwell time and firing time. These control words are periodically transferred to the RAM of the engine control unit for use in controlling the spark timing output signal. The engine control unit calculates the period of the reference pulses for use by the microprocessor in developing the control words. The engine control unit also uses the calculated period to adjust the spark timing output for variations in engine speed which occur between receipt of data from the microprocessor.

A more complete understanding of the present invention may be had from the following detailed description which should be read in conjunction with the drawings.

BRIEF DESCRIPTION OF THE DRAWINGS

FIG. 2 is a more detailed block diagram of the engine control unit of the present invention;

FIG. 2*a* is a diagram of one possible memory location arrangement in the read/write memory of the engine control unit; and FIG. 3(A-D) shows various stages of development of the spark timing output waveform.

Figure 1:
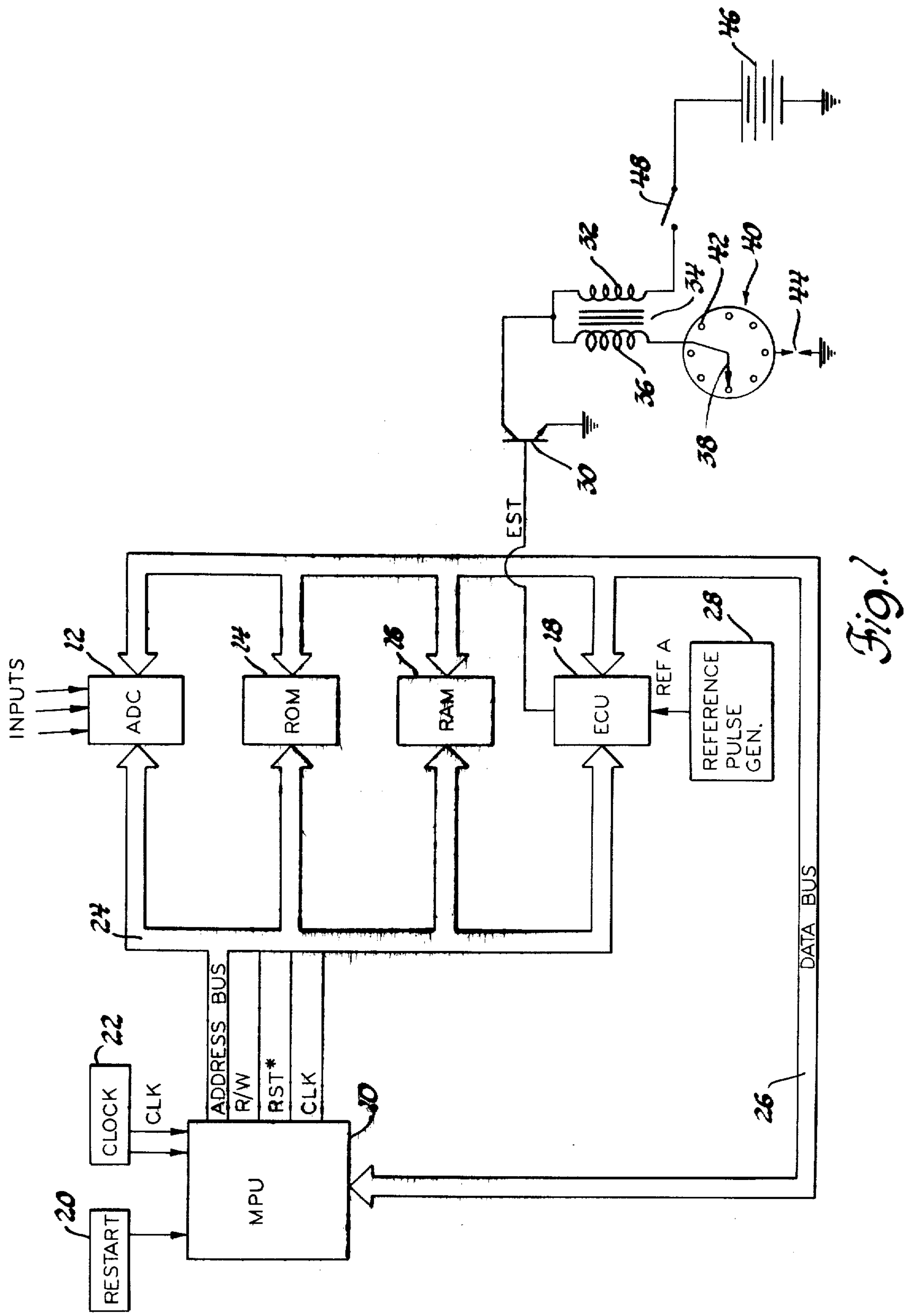
FIG. 1 is a block diagram of the engine control system of the present invention.

Referring now to the drawings and initially to FIG. 1, the engine control system of the present invention includes a microprocessor (MPU) 10, an A/D converter (ADC) 12, a read only memory (ROM) 14, a read/write memory (RAM) 16 and an engine control unit (ECU) 18. The MPU 10 may be the MC6800 microprocessor described in the M6800 Microprocessor Application Manual available from Motorola Semiconductor Products, Inc., Phoenix, Arizona and incorporated herein. The ADC 12, ROM 14 and RAM 16 may be any of a number of commercially available units compatible with the MPU 10. The MPU 10 receives inputs from a restart circuit 20 and generates a RST* signal for initializing the remaining components of the system. The MPU 10 also receives inputs from a clock 22 and generates the required timing signals for the remainder of the system. The MPU 10 communicates with the rest of the system via a 16 bit address bus 24 and 8 bit bi-directional data bus 26.

The ADC 12 preferably includes both the analog and digital subsystems normally associated with such units but if desired the MPU 10 may be programmed to perform the function of the digital subsystem as described in Application Note AN-757, Analog to Digital Conversion Techniques with the M6800 Microprocessor System available from Motorola Semiconductor Products, Inc., Phoenix, Arizona and incorporated herein.

The ADC 12 responds to a plurality of engine parameters such as manifold vacuum, barometric pressure and coolant temperature. The A to D conversion process is initiated on command from the MPU 10 which selects the input channel to be converted. At the end of the conversion cycle, the ADC 12 generates an interrupt after which the data is read over the data bus 26 on command from the MPU 10.

The ROM 14 contains the program for operating the MPU 10 and further contains appropriate engine control data in look-up tables which identify, as a function of engine parameters, an appropriate dwell time and firing time relative to the edge of a reference pulse in terms of a number of fixed frequency clock pulses. The look-up table data may be obtained experimentally or derived empirically. The MPU 10 may be programmed in a known manner to interpolate between the data at different entry points if desired. Control words specifying a desired dwell time and firing time are periodically transferred by the MPU 10 to the ECU 18 for generating the electronic spark timing output (EST). The ECU 18 also receives the aforementioned input reference pulses. These pulses, designated REF A, are indicative of engine crankshaft position and have a repetition rate proportional to engine speed and are supplied by a reference pulse generator 28. The ECU 18 computes the time interval between REF A pulses and this information is accessible to the MPU 10 for use in developing the dwell and firing time control words. The pulse generator 28 may be of any known type such as for example an electromagnetic or electro-optical transducer which responds to rotation of the distributor shaft or other input to provide a train of pulses having leading and falling edges which occur at a predetermined angle prior to top dead center position. For example, in an 8-cylinder engine, known transducers produce a reference pulse every 90° of crankshaft rotation having a leading and falling edge which defines a fixed dwell angle and firing angle. This signal may be used directly to control ignition firing during a back-up mode of operation such as during start or in the event of an electronic malfunction.

The EST output of the ECU 18 is coupled to a switching transistor 30 connected with the primary winding 32 of an ignition coil 34. Though not shown the EST output of the ECU may be multiplexed with the aforementioned back-up EST signals with the multiplexing being controlled by logic responsive to a crank input or computer malfunction input. The secondary 36 of ignition coil 34 is connected to the rotor contact 38 of a distributor generally designated 40 which sequentially connects contacts 42 on the distributor cap to respective spark plugs, one of which is illustrated by the reference numeral 44. The primary 32 of the ignition coil is connected to the positive side of the vehicle battery 46 through an ignition switch 48. The transistor 30 is switched on and off to cause spark firing energy to be developed to fire the spark plugs of the engine. The transistor 30 is turned on when the output of the ECU 18 switches from a low or EST* state to a high or EST state and is switched off when the output of the ECU 18 returns to the EST* state at which time the particular spark plug selected by the distributor 40 is fired.

Referring now to FIG. 2, the ECU 18 includes a 16 bit arithmetic logic unit (ALU) 50, a read/write memory (RAM) 52 containing a plurality of 16 bit registers, and a microprogrammed read only memory (ROM) 54. The various registers, of the RAM 52, utilized in controlling engine spark timing are identified by a mnemonic and a hexadecimal address in the diagram of FIG. 2a. The RAM 52 and ALU 50 are interconnected by an internal 16 bit bidirectional data bus 56. The internal data bus 56 is interfaced with the 8 bit external data bus 26 through conventional interface logic 58 which includes a 8 bit delay register to permit transfer of data between the ECU 18 and the MPU 10 on successive MPU cycles. The ROM 54 contains a microprogram for controlling generation of the EST output in accordance with data received from the MPU 10 and the generator 28 as well as internally generated clock signals and internal flags. The control unit 18 further includes a control register 60 which is loaded from the MPU 10 to selectively enable or disable various functions within the ECU 18. For example, in connection with the spark timing problem, one bit of the control register 60 would enable the EST output after the back-up mode is terminated. The ECU 18 is interfaced with control signals R/W, RST*, CLK, C/S and C/S* from the MPU 10 through bus control logic 62. The chip select inputs C/S and C/S* are two lines of the address bus 24. Whenever the ECU 18 is selected by the MPU 10 for a read/write operation, the logic 62 produces a HOLD output which effectively stops the operation of the ECU 18 for one MPU cycle and produces a BUS ENABLE command at the interface logic 58 controlling the direction of data transfer between the MPU 10 and ECU 18. The logic 62 also produces $\phi 1$ and $\phi 2$ clocking signals in response to the CLK input from the MPU 10 which provide the internal clocking of the ECU 18 at the same rate that the MPU 10 is operating, for example, 1.024 MHz. The logic 62 also produces an internal reset command in response to the RST* input from the MPU 10. The logic 62 responds to the C/S, C/S* and R/W inputs to select the ECU 18 for data exchange with the MPU 10. When the ECU 18 is selected the HOLD signal switches the multiplexer 64, which feeds the internal RAM address decoding circuitry, from the instruction register 72 to the address bus 24 permitting either the RAM 52 or the control register 60 to be addressed by the MPU 10.

The ROM 54 is programmed to enable the ECU 18 to carry out the necessary data operations to generate the EST output signal based on dwell time and firing time data supplied to the ECU 18 by the MPU 10. Access to the ROM 54 is through request logic 66 which includes a plurality of latches which are triggered by the leading edge of the designated inputs through a programmable logic array (PLA). The logic 66 further includes logic which establishes relative priority between inputs and/or input combinations. The output of the request logic 66 is applied to an address generator 68 which generates a starting address in the ROM 54 for service of the input selected by the logic 66. The latches in the logic 66 are initialized by the RESET signal. The control register 60 provides an input to the logic 66 which switches under MPU control from the normal to back-up mode of operation. The starting address selected by the generator 68 presets a program counter 70. The counter 70 is initialized to a default condition from the RESET signal. The ROM instruction addressed by the counter 70 is loaded into a 16 bit instruction register 72. Certain bits of each instruction are decoded by logic 74 to provide ALU control, increment the counter 70 and to enable a new vector at the completion of the subroutine called by the request logic 66. The logic 74 responds to the HOLD signal to stop program execution for one MPU cycle while data is being transferred between the MPU and the ECU.

The A input port of the ALU 50 receives data from the RAM 52 over the bus 56. The B input port receives data from a modulo sixteen counter 76 or the ALU output contained in a buffer register 78 through a multiplexer 80. Data from the counter 76 or register 78 is entered in RAM 52 through a multiplexer 82. The counter 76 is initialized by the RESET input and clocked at a 64 KHz rate from a $\div 16$ divider 84. The counter 76 provides a 32 KHz input to the request logic 66. The multiplexers 80 and 82 route the appropriate input in accordance with the data contained in the instruction register 72. One of the plurality of flag latches 85 are selected by logic 86 in accordance with the data in instruction register 72. The data to be loaded in the flag latches 85 is contained in each instruction and my be loaded in the latch unconditionally or conditioned upon the result of an ALU operation. The EST output is controlled from the flag latch output, designated F2. F2 is applied to synchronizing logic 88 which is enabled from the control register 60. The logic 88 includes a D-type flip-flop clocked by the 32 KHz input which transfers the F2 data at its D input to its Q output to produce the EST signal. The flag F2 as well as a flag FA provide inputs to the request logic 66.

The data regarding dwell is loaded by the MPU 10 into the RAM 52 at a 16 bit cell hereinafter referred to as ESTDWELL. This data is a binary representation of the number of 64 KHz clock pulses that the EST output is to remain high. The dwell time is computed by the MPU based on data contained in a look-up table stored in ROM 14 relating dwell to engine speed. The data representing the firing time is loaded by the MPU 10 into the RAM 52 at a 16 bit cell hereinafter referred to as ESTFAL. This data is a binary representation of the number of 64 KHz clock pulses between the falling edge of the EST output and its reference pulse REF A. It will be understood that a spark plug is fired each reference pulse, but the time of firing may be before (advance) or after (retard) the reference pulse depending upon engine operating parameters in order to achieve the desired ends of fuel economy, reduced emissions and improved drivability. ESTFAL is negative (2's complement) for an advance and positive for a retard. The firing time is computed by the MPU 10 based upon data contained in look-up tables stored in ROM 14. These tables define the firing time as a function of engine coolant temperature, manifold vacuum, barometric pressure and engine speed. The MPU 10 also computes the change in dwell and firing time since the previous update and loads this data into the RAM 52 at cells hereinafter referred to as RISCHG and FALCHG, respectively. FALCHG is equal to ESTFAL (last) − ESTFAL (current) and RISCHG is equal to FALSCHG + ESTDWELL (last) − ESTDWELL (current). Thus the FALCHG and RISCHG data represent a desired adjustment of the falling and rising edges of the EST output relative to its reference pulse. When the MPU 10 writes to ESTFAL, address decode logic 90 provides an input designated WRU to the logic 66.

The operation of the ECU 18 will now be described with reference to FIG. 3 and Tables A and B. In Table B the negative sign indicates that the data at input A of ALU 50 is complemented prior to the addition operation.

TABLE A

| INPUT | RELATIVE PRIORITY | ROM ADDRESS (HEX) | ROM STEPS |
|---|---|---|---|
| REF A | 1 | 24 | 10 |
| F2* (EST ↓) | 2 | 33 | 4 |
| F2 (EST ↑) . CR2 | 3 | 38 | 4 |
| FA | 4 | 3C | 4 |
| 32 KHz . F2 | 5 | 37 | 1 |

TABLE A-continued

| INPUT | RELATIVE PRIORITY | ROM ADDRESS (HEX) | ROM STEPS |
|---|---|---|---|
| 32 KHz . F2* . CR2 | 6 | 3B | 1 |
| F2 . WRU | 7 | 19 | 3 |
| F2 . WRU | 8 | 17 | 2 |
| F2* . WRU | 9 | 14 | 5 |
| DEFAULT | — | 3F | 1 |

TABLE B

| ROM STEPS | $N_F$ | ROM ADDRESS (HEX) | R/W | RAM ADDRESS | ALU A | ALU B |
|---|---|---|---|---|---|---|
| 1 | 0 | 14 | R | RISCHG | + | +0 |
| 2 | 0 | 15 | R | RISREF | + | +ALU |
| 3 | 0 | 16 | W | RISREF | | |
| 4 | 0 | 17 | R | ESTFAL | + | +0 |
| 5 | 1 | 18 | W | OLDFAL | + | +0 |
| 1 | 0 | 19 | R | FALCHG | + | +0 |
| 2 | 0 | 1A | R | FALREF | + | +ALU |
| 3 | 1 | 1B | W | FALREF | + | +0 |
| 1 | 0 | 24 | R | NEXR | − | +COUNTER |
| 2 | 0 | 25 | E | FALREF | + | +ALU |
| 3 | 0 | 26 | W | FALREF | + | +0 |
| 4 | 0 | 27 | R | NEXR | − | +COUNTER |
| 5 | 0 | 28 | R | RISREF | + | +ALU |
| 6 | 0 | 29 | W | RISREF | + | +0 |
| 7 | 0 | 2A | R | REFTIME | − | +COUNTER |
| 8 | 0 | 2B | W | REFPER | + | +COUNTER |
| 9 | 0 | 2C | W | NEXR | + | +0 |
| 10 | 1 | 2D | W | COUNTER→REFTIME | | |
| 1 | 0 | 33 | R | FALREF | + | +0 |
| 2 | 0 | 34 | R | REFPER | + | +ALU |
| 3 | 0 | 35 | R | ESTDWELL | − | +ALU |
| 4 | 1 | 36 | W | RISREF | − | +COUNTER |
| 1 | 1 | 37 | R | FALREF 0→F2≦ | − | +COUNTER |
| 1 | 0 | 38 | R | OLDFAL 0→FA | + | +0 |
| 2 | 0 | 39 | R | REFTIME | + | +ALU |
| 3 | 0 | 3A | W | FALREF 1→FA≦ | − | +COUNTER |
| 1 | 1 | 3B | R | RISREF 1→F2≦ | − | +COUNTER |
| 1 | 0 | 3C | R | FALREF 0→FA | + | + |
| 2 | 0 | 3D | R | REFPER | + | +ALU |
| 3 | 0 | 3E | W | FALREF 1→FA≦ | − | +COUNTER |
| 4 | 1 | 3F | W | — | | +O |

For purposes of explanation it will be assumed that the counter 76, which is advancing at a 64 KHz rate, has a prsent value represented by the arrow in FIG. 3A. It will also be assumed that the ECU 18 is updated by the CPU 10 at the time indicated by the arrow of FIG. 3A. As will be apparent hereinafter, a RAM cell RISREF contains a number placed there by the ECU 18 which corresponds to the value of the counter 76 when the EST output should next go high and that a RAM cell FALREF contains a number placed there by the ECU 18 which corresponds to the value of the counter 76 when the EST output goes low. Also, a RAM cell REFTIME contains a number placed there by the ECU 18 which corresponds to the value of the counter 76 when the last reference pulse occurred, a RAM cell REFPER contains a number placed there by the ECU 18 which corresponds to the difference between the value of the counter at the last two reference pulses, and a RAM cell NEXR contains a number placed there by the ECU 18 which corresponds to the predicted counter value at the next reference pulse. With the counter 76 in the state represented by the arrow in FIG. 3A, the EST output is low (F2* is high) when the WRU input occurs. Since F2* is high, the leading edge of WRU initiates a service request having a relative priority of 9 (Table A). This subroutine updates RISREF, FALREF and OLDFAL to reflect the latest data from the MPU 10. When this request is granted, the program counter is set to ROM address 14 (HEX). This subroutine beginning at address 14 causes the content of RISCHG to be read from the RAM 52 (Step 1), added to the content of RISREF (Step 2) and stored in RISREF (Step 3). In Step 4, the content of ESTFAL is read from the RAM 52 and in the Step 5 ESTFAL is written into OLDFAL. When the instruction contained at ROM address 18 is executed, the service request for this subroutine is reset by the enable new vector bit $N_V$ in the instruction. The highest priority pending request is granted by the logic 66 whenever the enable new vector signal occurs and if no request is pending a default vector is generated to ROM location 3F. With F2* high, the rising edge of the next 32 KHz clock pulse initiates a service request having a relative priority of 6. When this request is granted, the program counter is set to ROM address 3B. The subroutine beginning at ROM address 3B is a single step SEARCH FOR RISE which causes the content of RISREF to be compared with the content of the counter 76 by adding the value of the counter 76 to the complemented value of RISREF. If the value of the counter 76 is equal to or greater than the value of RISREF (FIG. 3B), a carry is generated by the ALU 50 and flag F2 is set to a one. When F2 is set to a one, the EST output is driven high by the logic 88 on the next 32 KHz clock pulse. When F2 is set, a service request is initiated having a relative priority of 3. When this request is granted a subroutine beginning at ROM address 38 is initiated. The purpose of this subroutine is to predict the counter value at the next fire point (FALREF). This is accomplished by adding the content of OLDFAL and REFTIME (Steps 1-2). The result is loaded into FALREF in Step 3. In Step 3 the value of FALREF is also compared with the value of the counter 76 to determine if the value of FALREF, computed in Step 2, is equal to or greater than the present state of the counter. The value of FALREF computed in Step 2 may or may not be greater than the present state of the counter depending on the firing conditions and dwell time commanded by the MPU 10. Two examples will illustrate the necessity for testing the value of FALREF to insure that the calculated value is greater than the counter 76. Assuming a constant engine speed, if OLDFAL is negative (advance) FALREF will be less than the value of the counter 76 when the instruction at ROM address 3A is executed. On the other hand, if OLDFAL is positive (retard) and greater in magnitude than ESTDWELL then FALREF will be greater than the value of the counter 76. If FALREF is equal to or greater than the counter 76, a new vector is enabled by executing the instruction at ROM address 3B. If FALREF is less than the counter 76, flag FA is set which initiates a service request having a relative priority of 4. When this request is granted, the subroutine having an initial instruction at ROM address 3C is initiated. The subroutine beginning at ROM address 3C causes REFPER to be added to FALREF (Steps 1-2) and FALREF is again stored and compared with the counter 76 (Step 3). This subroutine is repeated until FALREF is equal to or greater than the counter 76 whereupon flag FA is cleared. Exit from this subroutine is by the new vector enable contained in default or no-op instruction 3F. After FALREF is computed, a SEARCH FOR FALL is initiated at a 32 KHz rate. The search for fall is a one-step subroutine beginning at ROM address 37 and having a relative priority of 5. When the counter 76 advances to a value which is equal to or greater than FALREF (FIG. 3C), flag F2 is cleared and on the next 32 KHz pulse, the EST output falls. When F2 is cleared, (F2* is high) a subroutine is initiated beginning at ROM address 33 to predict the counter value when the EST output should next rise (RISREF). This subroutine has a relative priority of 2 and involves adding the content of REFPER to FALREF and subtracting ESTDWELL (Steps 1-3). In Step 4, RISREF is updated and compared with the counter 76 and a new vector is enabled. The previously discussed SEARCH FOR RISE subroutine at ROM address 3B then occurs at a 32 KHz rate. The rising edge of a REF A pulse (FIG. 3D) causes the program counter 70 to be loaded with ROM address 24 which is the initial instruction in a subroutine having the highest relative priority for correcting the predicted RISREF and FALREF numbers for any error in the predicted time of REF A (NEXR), made at T2, computing the reference pulse period (REFPER) and predicting the counter content at the next reference pulse (NEXR). The reference pulse period stored in REFPER is accessible by the MPU 10 for computing engine speed and for developing the ESTFAL and ESTDWELL data. Steps 1-3 of this subroutine subtract NEXR from the counter 76 to determine the error in prediction of the time of occurrence of REF A (made at T2), adds the error to FALREF and stores the corrected FALREF number. The same correction is made with respect to RISREF in Steps 4-6. In Step 7 the value of the counter 76 at the previous REF A, contained in RAM cell REFTIME, is subtracted from the present value of the counter 76 to compute the time interval between reference pulses (REFPER). In Step 8 the results of Step 7 (contained in register 78) is stored in RAM cell REFPER while adding the result of the Step 7 operation (REFPER) to the counter 76 to predict the value of the counter (NEXR) when the next reference pulse should occur based on the assumption that the reference pulses are occurring at a constant frequency. Any error in the computed values of RISREF or FALREF as a result of this potentially erroneous assumption, are corrected when the next reference pulse actually occurs (T4) as explained above in connection with the reference pulse occurring at T3. In Step 9 NEXR (contained in register 78) is stored and in Step 10 the value of the counter 76 is stored in RAM cell REFTIME.

If the MPU update of the ECU has occurred while the flag F2 was set (EST output high) subroutines having relative priorities of 7 and 8 are called. Accordingly, the subroutine starting at ROM address 19 is initiated to update FALREF by the amount of FALCHG and thereafter the subroutine starting at ROM address 17 is initiated for updating OLDFAL with the content of ESTFAL.

The operation of the ECU 18 in performing the EST output control may be summarized by the following logic equations which define the operations occurring in response to the underlined inputs:

| REF A (REFERENCE PULSE) |
| --- |
| FALREF = CNT − NEXR + FALREF |
| RISREF = CNT − NEXR + RISREF |
| REFPER = CNT − REFTIME |
| NEXR = REFPER + CNT |
| REFTIME = CNT |
| EST ↓ (FALLING EDGE OF EST) |
| RISREF = FALREF + REFPER − ESTDWELL |
| EST ↑ (RISING EDGE OF EST) |

-continued

| REF A (REFERENCE PULSE) |
|---|
| FALREF = OLDFAL + REFTIME≦CNT 1→FA |
| FA (RISING EDGE OF FA) |
| FALREF = 0→FA FALREF + REFPER≦CNT 1→FA |
| 32 KHz . EST (EST HIGH) |
| CNT − FALREF≦0 EST GOES LOW |
| KHz . EST* (EST LOW) |
| CNT RISREF≦0 EST GOES HIGH |
| EST . WRU (WRITING TO ESTFAL) |
| FALREF = FALREF + FALCHG |
| OLDFAL = ESTFAL |
| EST* . WRU (WRITING TO ESTFAL) |
| RISREF = RISREF + RISCHG |
| OLDFAL = ESTFAL |

It will be noted from the above discussion that the EST output variables RISREF and FALREF are calculated using the most recent MPU supplied data located in OLDFAL and ESTDWELL each reference pulse. At engine speeds where the period of REF A is less than the update interval of the MPU 10, the RISCHG and FALCHG data will be of less significance because the changes in engine speed are not as great. Therefore, the MPU 10 may be programmed to load the firing point into OLDFAL rather than ESTFAL, when REFPER as computed by the ECU 18 and accessible to the MPU 10 is less than a predetermined value. This will avoid the necessity of the ECU 18 executing the update subroutine called for when the MPU 10 writes to ESTFAL. The update routine initiated by writing to ESTFAL is desirable at lower speeds, where one or more MPU updates may occur between reference pulses, in order to utilize the latest data regarding dwell and fire point as soon as it is available from the MPU 10.

Of significance in the operation of the ECU is the fact that FALREF is calculated when the EST output rises and RISREF is calculated when the EST output falls and the calculation of FALREF is based on OLDFAL data. This permits a simple one-step SEARCH FOR RISE and SEARCH FOR FALL subroutine which accurately controls the output waveform during engine accelerations and decelerations.

The embodiments of the invention in which an exclusive property or privilege is claimed are defined as follows:

1. Apparatus for generating a rectangular wave output signal referenced to input reference pulses indicative of engine crankshaft position and having a repetition rate proportional to engine speed for controlling the spark timing of an engine comprising:

a counter, means for incrementing said counter at a predetermined frequency, read/write memory means comprising a plurality of registers for data storage including a first register for storing a binary word corresponding to the number of counts of said counter that said output should remain high, and a second register for storing a binary word corresponding to the number of counts of said counter that should occur between the fall of said output and the occurrence of a reference pulse, means for performing arithmetic operations relative to the content of said read/write memory registers and said counter, output means for producing said output signal, control means including a ROM containing a plurality of subroutines, each subroutine containing one or more instructions, said control means including means responsive to a plurality of inputs including said reference pulses for accessing said ROM in response to said inputs or combinations thereof for initiating a subroutine associated with each of said inputs or input combinations, said control means including means responsive to said instructions for controlling said read/write memory means, said arithmetic means and said output means in accordance with the instructions contained in said ROM, said control means responsive to a reference pulse for initiating a subroutine which calculates the period between the present and previous reference pulse based on the difference between the value of the counter at the present and previous reference pulses and stores said calculated value of the period in said read/write memory means, predicts the value of the counter when the next reference pulse should occur by adding the calculated value of the period to the present value of the counter and stores said predicted value in said read/write memory means, and stores the present value of the counter in said read/write memory means, said control means responsive to an input indicative of a rise of said output for initiating a subroutine which calculates a value for the counter when the output should next fall by adding the value of the content of said second register to the counter content at the previous reference pulse and if the calculated fall value is less than the present value of the counter adding the calculated value of the period of the reference pulses thereto until the calculated fall value is equal to or greater than the present content of the counter and stores the calculated fall value in said read/write memory, said control means responsive to a fixed frequency input and an input indicating that said output has risen for periodically comparing the present counter content with the calculated fall value and causing the output to fall when the counter content is equal to or greater than the calculated fall value, said control means responsive to an input indicating that said output has fallen for initiating a subroutine which calculates a value of the counter when the output should next rise by subtracting the content of said first register from the sum of the calculated fall value and calculated period of the reference pulses and stores the calculated rise value in said read/write memory, said control means responsive to said fixed frequency input and an input indicating that said output has fallen for periodically initiating a subroutine which compares the present counter content with the calculated rise value and causes the output to rise when the counter content is equal to or greater than the calculated rise value, the subroutine initiated in response to said reference pulses including instructions for adjusting said calculated rise and fall values by the difference between the predicted and actual value of the counter at the occurrence of a reference pulse.

2. Apparatus for generating a rectangular wave output signal referenced to input reference pulses indicative to engine crankshaft position and having a repetition rate proportional to engine speed for controlling the spark timing of an engine comprising:

a counter, clock means operating at a predetermined frequency, means responsive to said clock means for incrementing said counter at a submultiple of said predetermined frequency to provide a time base for determining when said output signal should rise and fall relative to said reference pulses, read/write memory means responsive to said clock means and comprising a plurality of registers for data storage including a first register for storing a first binary word corresponding to the time that said output should remain high, and a second register for storing a second binary word corresponding to the time interval between the fall of said output signal and the occurrence of a reference pulse, means responsive to engine operating conditions for periodically updating the content of said first and second registers, means responsive to said clock means for performing arithmetic operations relative to the content of said read/write memory registers and said counter, output means for producing said output signal, control means responsive to said clock means and including a ROM containing a plurality of subroutines, each subroutine containing one or more instructions, said control means including means responsive to a plurality of inputs including said reference input pulses for accessing said ROM in response to said inputs or combinations thereof for initiating a subroutine associated with each of said inputs or input combinations, said control means including means responsive to said instructions for controlling said read/write memory means, said arithmetic means and said output means in accordance with the instructions contained in said ROM, said control means responsive to a reference pulse for initiating a subroutine which; calculates the time interval between the present and previous reference pulse based on the difference between the value of the counter at the present and previous reference pulses and stores said calculated time interval in said read/write memory, predicts the time when the next reference pulse should occur by adding the calculated time interval between pulses to the time of occurrence of the reference pulse and stores said predicted time interval in said read/write memory, and stores the time of occurrence of the reference pulse in said read/write memory means, said control means responsive to an input indicative of a rise of said output for initiating a subroutine which calculates the time when the output should next fall by adding said second binary word to the time of occurrence of the previous reference pulse and if the calculated fall time is less than the present value of the counter adding the calculated time interval between reference pulses thereto until the calculated fall time is equal to or greater than the present content of the counter, and stores the calculated fall time in said read/write memory means, said control means responsive to said clock means and an input indicating that said output has risen for periodically comparing the present counter content with the calculated fall time and causing the output to fall when the counter content is equal to or greater than the calculated fall time, said control means responsive to an input indicating that said output has fallen for initiating a subroutine which calculates the time when the output should next rise by subtracting said first binary word from the sum of the calculated fall time and calculated time interval between reference pulses, and stores said calculated rise time in said read/write memory, said control means responsive to said clock means and an input indicating that said output has fallen for periodically initiating a subroutine which compares the present counter content with the calculated rise time and causes the output to rise when the counter content is equal to or greater than the calculated rise time, the subroutine initiated in response to said reference pulses including instructions for adjusting said calculated rise and fall times by the difference between the predicted and actual time of occurrence of a reference pulse.

3. Apparatus for controlling the spark timing of an engine comprising:

means for generating a train of input reference pulses indicative of engine crankshaft position and having a repetition rate proportional to engine speed, counter means, clock means operating at a predetermined frequency, means responsive to said clock means for incrementing said counter means at a submultiple of said predetermined frequency, read/write memory means responsive to said clock means comprising a RISREF register for storing a binary word corresponding to the content of said counter means when said output should rise, a FALREF register for storing a binary word corresponding to the content of said counter means when said output should fall, an ESTDWELL register for storing a binary word corresponding to the number of counts of said counter means that said output should remain high, an OLDFAL register for storing a binary word corresponding to the number of counts of said counter means that should occur between the fall of said output and the occurrence of a reference pulse, a REFTIME register for storing the content of said counter means upon the occurrence of a reference pulse, a REFPER register for storing a binary word corresponding to the number of counts of said counter means between reference pulses, a NEXR register for storing a binary word corresponding to the predicted content of said counter means at the next reference pulse, means responsive to engine operating conditions of periodically updating the contents of said OLDFAL and ESTDWELL registers, means responsive to said clock means for performing arithmetic operations relative to the content of said read/write memory registers and said counter means, bistable output means responsive to said clock means and said arithmetic means for producing a rectangular wave output signal synchronized with said clock means, control means responsive to said clock means and including a ROM containing a plurality of subroutines, each subroutine containing one or more instructions, said control means including means responsive to a plurality of inputs for accessing said ROM in response to said inputs or combinations thereof for initiating a subroutine associated with each of said inputs or input combinations, said control means including means responsive to said instructions for controlling data transfers between said counter means, said arithmetic means and said read/write memory means and, for controlling the operation of said arithmetic means and for controlling the state of said output means in accordance with the results of operations of said arithmetic means, said control means responsive to an input indicative of a rise of said output for initiating a subroutine which updates the content of said FALREF register with the sum of the contents of said OLDFAL and REFTIME registers and which adds the content of said REFPER register thereto a sufficient number of times to cause the content of said FALREF register to be equal to or greater than the content of said counter means, said control means responsive to a submultiple of said clock frequency and an input indicating that the output has risen for periodically initiating a subroutine which compares the content of said counter means with the content of said FALREF register and which causes the output to fall when the content of said counter means is equal to or greater than the content of said FALREF register, said control means responsive to an input indicative of a fall of said output for initiating a subroutine which updates the content of said RISREF register with the difference between the content of said ESTDWELL register and the sum of the contents of said FALREF and REFPER registers, said control means responsive to said submultiple of said clock frequency and an input indicating that said output has fallen for periodically initiating a subroutine which compares the content of said counter means with the content of said RISREF register and which causes the output to rise when the content of said counter means is equal to or greater than the content of said RISREF register, said control means responsive to a reference pulse for initiating a subroutine which modifies the content of said FALREF and RISREF registers by the difference between the content of said counter means and the content of said NEXR register, which updates the content of said REFPER register by the difference between the content of the counter means and the content of said REFTIME register, which updates the content of said NEXR register by the sum of the content of the counter means and said REFPER register and which updates the content of said REFTIME register with the content of said counter means, and an ignition circuit responsive to said output signal.

4. Apparatus for controlling the spark timing of an engine comprising:

means for generating a train of input reference pulses indicative of engine crankshaft position and having a repetition rate proportional to engine speed, a binary counter, clock means operating at a predetermined frequency, means responsive to said clock means for incrementing said counter at a submultiple of said predetermined frequency, read/write memory means responsive to said clock means and comprising a RISREF register for storing a binary word corresponding to the content of said counter when said output should rise, a FALREF register for storing a binary word corresponding to the content of said counter when said output should fall, an ESTDWELL register for storing a binary word corresponding to the number of counts of said counter that said output should remain high, an ESTFAL register for storing a binary word corresponding to the number of counts of said counter that should occur between the fall of said output and a reference pulse, a REFTIME register for storing the content of said counter upon the occurrence of a reference pulse, a REFPER register for storing a binary word corresponding to the number of counts of said counter between reference pulses, a NEXR register for storing a binary word corresponding to the predicted content of said counter at the next reference pulse, a FALCHG register for storing a binary word corresponding to the difference between the present and previous content of said ESTFAL register, a RISCHG register for storing a binary word corresponding to the sum of the difference between the present and previous contents of said ESTDWELL register and said FALCHG register, and an OLDFAL register, means responsive to engine operating conditions for periodically updating the content of said ESTFAL, RISCHG, FALCHG and ESTDWELL registers, means responsive to said clock means for performing arithmetic operations relative to the contents of said read/write memory registers and said counter means, bistable output means responsive to said clock means and said arithmetic means for producing a rectangular wave output signal synchronized with said clock means, control means responsive to said clock means and including a ROM containing a plurality of subroutines, each subroutine containing one or more instructions, said control means including means responsive to a plurality of inputs for accessing said ROM in response to said inputs or combinations thereof for initiating a subroutine associated with each of said input or input combinations on a pivotized basis, said control means including means responsive to said instructions for controlling said read/write memory means, said arithmetic means and said output means in accordance with the instructions contained in said ROM, said control means responsive to the updating of said ESTFAL register for initiating a subroutine which; updates the content of said FALREF register by the sum of the content of said FALREF and FALCHG registers or updates the content of said RISREF register by the sum of the contents of said RISREF and RISCHG registers depending upon whether said output is respectively high or low, and updates the content of said OLDFAL register with the content of said ESTFAL, said control means responsive to an input indicative of a rise of said output for initiating a subroutine which updates the content of said FALREF register with the sum of the contents of said OLDFAL and REFTIME registers and which adds the content of said REFPER register thereto a sufficient number of times to cause the content of said FALREF register to be equal to or greater than the content of said counter, said control means responsive to said clock means and an input indicating that the output has risen for periodically initiating a subroutine which compares the content of said counter with the content of said FALREF register and which causes the output to fall when the content of said counter is equal to or greater than the content of said FALREF register, said control means responsive to an input indicative of a fall of said output for initiating a subroutine which updates the content of said RISREF register by the difference between the content of said EST-DWELL register and the sum of the contents of said FALREF and REFPER registers, said control means responsive to said clock means and an input indicating that said output has fallen for periodically initiating a subroutine which compares the content of said counter with the content of said RISREF register and which causes the output to rise when the content of said counter is equal to or greater than the content of said RISREF register, said control means responsive to a reference pulse for initiating a subroutine which modifies content of said FALREF and RISREF registers by the difference between the content of said counter and the content of said NEXR register, which updates the content of said REFPER register by the difference between the content of the counter and the content of said REFTIME register, which updates the content of said NEXR register by the sum of the content of the counter and said REFPER register and which updates the content of said REFTIME register with the content of said counter, and an ignition circuit responsive to said output signal.

5. Apparatus for generating a rectangular wave output signal referenced to input pulses indicative of engine crankshaft position and having a repetition rate proportional to engine speed for controlling the spark timing of an engine comprising:

a counter timing means for incrementing said counter at a predetermined frequency, read/write memory means comprising a RISREF register for storing a binary word corresponding to the content of said counter when said output should rise, a FALREF register for storing a binary word corresponding to the content of said counter when said output should fall, an EST-DWELL register for storing a binary word corresponding to the number of counts of said counter that said output should remain high, an OLDFAL register for storing a binary word corresponding to the number of counts of said counter that should occur between the fall of said output and the occurrence of a reference pulse, a REFTIME register for storing the content of said counter upon the occurrence of a reference pulse, a REFPER register for storing a binary word corresponding to the number of counts of said counter between reference pulses, a NEXR register for storing a binary word corresponding to the predicted content of said counter at the next reference pulse, means for performing arithmetic operations relative to the content of said read/write memory registers and said counter, first and second flag latches, control means including a ROM containing a plurality of subroutines, each subroutine containing one or more instructions, said control means including means responsive to said reference pulses, the state of said flag latches, and a fixed frequency input for accessing said ROM in response to one of said inputs or combinations thereof to initiate a subroutine associated with each of said inputs or input combinations based on a predetermined relative priority between said inputs or input combinations, said control means including means responsive to said instructions for (a) controlling data transfers between said counter, said arithmetic means and said read/write memory means, (b) controlling the operation of said arithmetic means, (c) selecting one of said flag latches, and (d) controlling the state of the selected flag latch in accordance with the results of operation of said arithmetic means, said control means responsive to the setting of said first flag latch for initiating a subroutine which updates the content of said FALREF register with the sum of the contents of said OLDFAL and said REFTIME registers and which sets said second flag latch if the sum thereof is less than the content of said counter, said control means responsive to the setting of said second flag latch to reset said second flag latch and for adding the content of said REFPER register to the content of said FALREF register and setting said second flag latch if the content of said FALREF register is less than or equal to the content of said counter, said control means responsive to said fixed frequency input and the reset state of said first flag latch for periodically initiating a subroutine which compares the content of said counter with the content of said FALREF register and resets said first flag latch when the content of said counter is equal to or greater than the content of said FALREF register, said control means responsive to the resetting of said first flag latch for initiating a subroutine which updates the content of said RISREF register by the difference between the content of said EST-DWELL register and the sum of the contents of said FALREF and REFPER registers, said control means responsive to said fixed frequency input and the reset state of said first latch means for periodically initiating a subroutine which compares the content of said counter with the content of said RISREF register and sets said first flag latch when the content of said counter is equal to or greater than the content of said RISREF register, said control means responsive to the occurrence of a reference pulse for initiating a subroutine which (a) modifies the content of said FALREF and RISREF registers by the difference between the content of said counter and the content of said NEXR register, (b) updates the content of said REFPER register by the difference between the content of said counter and the content of said REFTIME register, (c) updates the content of said NEXR register by the sum of the content of said counter and said REFPER register, and (d) updates the content of said REFTIME register with the content of said counter, bistable output means responsive to said fixed frequency input and to the state of said first flag latch for producing said output signal.

* * * * *

UNITED STATES PATENT AND TRADEMARK OFFICE

CERTIFICATE OF CORRECTION

PATENT NO. : 4,231,091

DATED : October 28, 1980

INVENTOR(S) : Phillip R. Motz

It is certified that error appears in the above-identified patent and that said Letters Patent are hereby corrected as shown below:

Column 6, line 22, "2 0 25 E FALREF + +ALU" should read -- 2 0 25 R FALREF + +ALU --;

Column 6, line 44, "prsent" should read -- present --.

Column 8, line 67, "EST↓(FALLING EDGE OF EST)" should be underlined, i.e., should read -- EST↓(FALLING EDGE OF EST) --;

Column 8, line 69, "EST↑(RISING EDGE OF EST)" should be underlined, i.e., should read -- EST↑(RISING EDGE OF EST) --.

Column 9, line 4, "FA (RISING EDGE OF FA)" should be underlined, i.e., should read -- FA (RISING EDGE OF FA) --;

Column 9, line 6, "32 KHz . EST (EST HIGH)" should be underlined, i.e., should read -- 32 KHz · EST (EST HIGH) --;

UNITED STATES PATENT AND TRADEMARK OFFICE

CERTIFICATE OF CORRECTION

PATENT NO. : 4,231,091

DATED : October 28, 1980

INVENTOR(S) : Phillip R. Motz

It is certified that error appears in the above-identified patent and that said Letters Patent are hereby corrected as shown below:

Column 9, line 8, "KHz . EST* (EST LOW)" should be underlined and corrected, i.e., should read -- 32 KHz · EST* (EST LOW) --;

Column 9, line 10, "EST . WRU (WRITING TO ESTFAL)" should be underlined, i.e., should read -- EST · WRU (WRITING TO ESTFAL) --;

Column 9, line 13, "EST* . WRU (WRITING TO ESTFAL)" should be underlined, i.e., should read -- EST* · WRU (WRITING TO ESTFAL) --.

Column 10, line 12, after "Which" insert -- ; --.

Column 12, line 50, "of" should read -- for --.

Signed and Sealed this

*Ninth* Day of *June 1981*

[SEAL]

*Attest:*

RENE D. TEGTMEYER

*Attesting Officer* *Acting Commissioner of Patents and Trademarks*